United States Patent
Weyers et al.

(10) Patent No.: US 8,097,880 B2
(45) Date of Patent: Jan. 17, 2012

(54) SEMICONDUCTOR COMPONENT INCLUDING A LATERAL TRANSISTOR COMPONENT

(75) Inventors: Joachim Weyers, Hoehenkirchen (DE); Anton Mauder, Kolbermoor (DE); Franz Hirler, Isen (DE); Paul Kuepper, Glonn (DE)

(73) Assignee: Infineon Technologies Austria AG, Villach (AT)

( * ) Notice: Subject to any disclaimer, the term of this patent is extended or adjusted under 35 U.S.C. 154(b) by 182 days.

(21) Appl. No.: 12/421,346

(22) Filed: Apr. 9, 2009

(65) Prior Publication Data

US 2010/0258801 A1    Oct. 14, 2010

(51) Int. Cl.
*H01L 29/04*     (2006.01)
(52) U.S. Cl. ..... 257/57; 257/66; 257/335; 257/E29.289; 257/E29.292; 257/E29.261; 438/149
(58) Field of Classification Search .............. 257/57, 257/66, 335, E29.289, E29.292, E29.261; 438/149
See application file for complete search history.

(56) References Cited

U.S. PATENT DOCUMENTS

| | | | |
|---|---|---|---|
| 2002/0090540 A1* | 7/2002 | Einhart et al. | 429/32 |
| 2009/0189216 A1* | 7/2009 | Werner et al. | 257/328 |

FOREIGN PATENT DOCUMENTS

| | | |
|---|---|---|
| DE | 102005039331 A1 | 2/2007 |
| DE | 102006009942 A1 | 9/2007 |
| WO | 2007012490 A2 | 2/2007 |

OTHER PUBLICATIONS

"n-Type Organic Thin Film Transistor Prepared by Printing Method", (Translation of the AIST press released on Nov. 8, 2004), http://www.aist.go.jp/aist_e/latest_research/2004/20041118/20041118.html.
Voutsas et al., "Next Generation of Poly-Si TFT Technology: Material Improvements and Novel Device Architectures for System-On-Panel (SOP)", pp. 29-34.
Chow et al., "High Voltage Thin Film Transistors Integrated with MEMS" (15 pages).
Dimitrakopoulos et al., "Organic Thin-Film Transistors: A Review of Recent Advances", IBM J. Res. & Dev., vol. 45, No. 1, Jan. 2001, pp. 11-27.
Halik et al., "High-Mobility Organic Thin-Film Transistors based on $\alpha$, $\alpha'$-didecyloligothiophenes", Journal of Applied Physics, vol. 93, No. 5, Mar. 1, 2003, pp. 2977-2981.
"Continuous Grain Silicon—die Basis für System-LCDs", Displays & Optoelektropik—Jun. 2009, p. 21.

* cited by examiner

*Primary Examiner* — Bradley K. Smith
*Assistant Examiner* — Jami M Valentine
(74) *Attorney, Agent, or Firm* — Dicke, Billig & Czaja, PLLC

(57) ABSTRACT

A semiconductor component including a lateral transistor component is disclosed. One embodiment provides an electrically insulating carrier layer. A first and a second semiconductor layer are arranged on above another and are separated from another by a dielectric layer. The first semiconductor layer includes a polycrystalline semiconductor material, an amorphous semiconductor material or an organic semiconductor material. In the first semiconductor layer: a source zone, a body zone, a drift zone and a drain zone are provided. In the second semiconductor layer; a drift control zone is arranged adjacent to the drift zone, including a control terminal at a first lateral end for applying a control potential, and is coupled to the drain zone via a rectifying element at a second lateral end. A gate electrode is arranged adjacent to the body zone and is dielectrically insulated from the body zone by a gate dielectric layer.

13 Claims, 9 Drawing Sheets

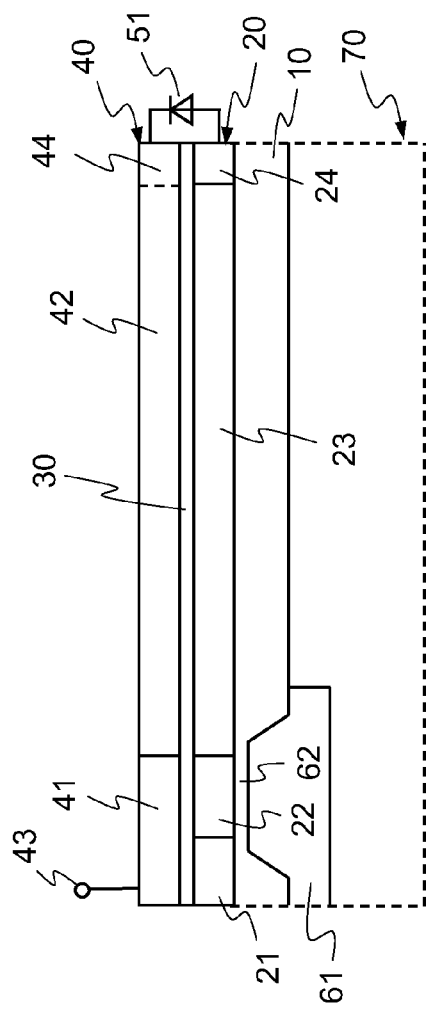
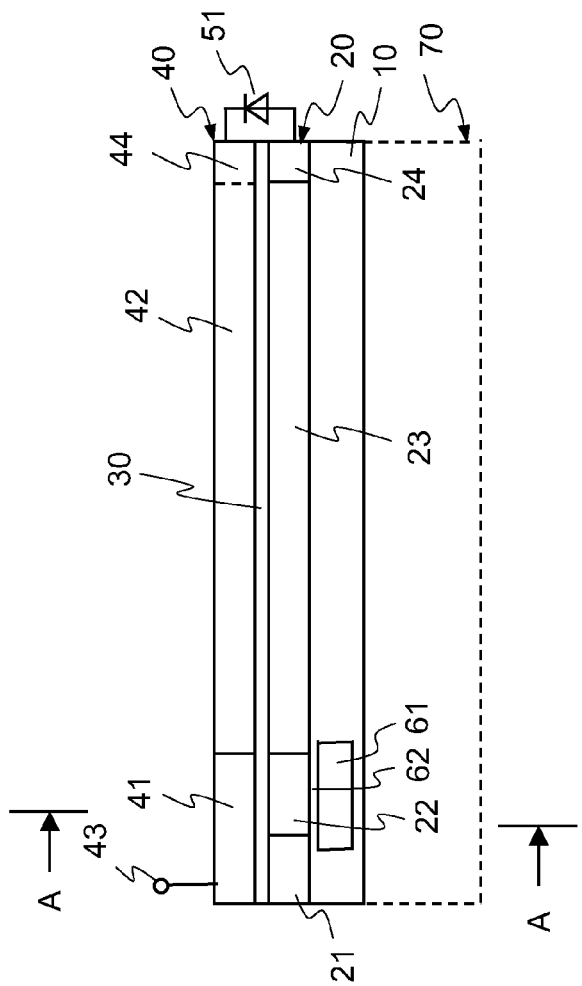
FIG 1
FIG 2

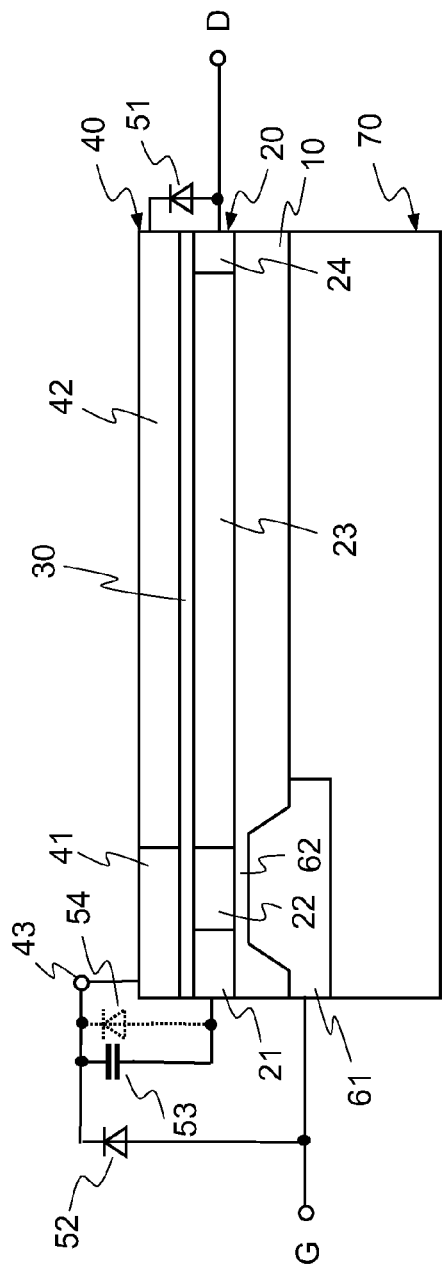
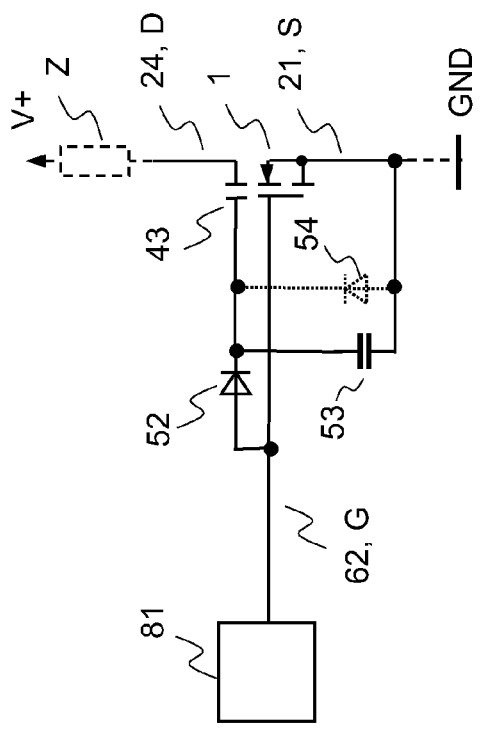
FIG 4
FIG 5

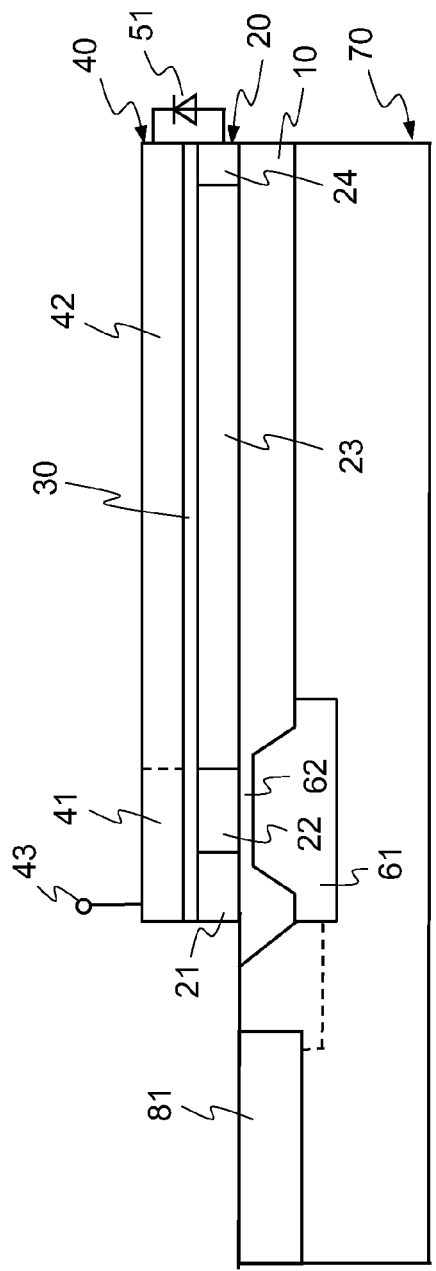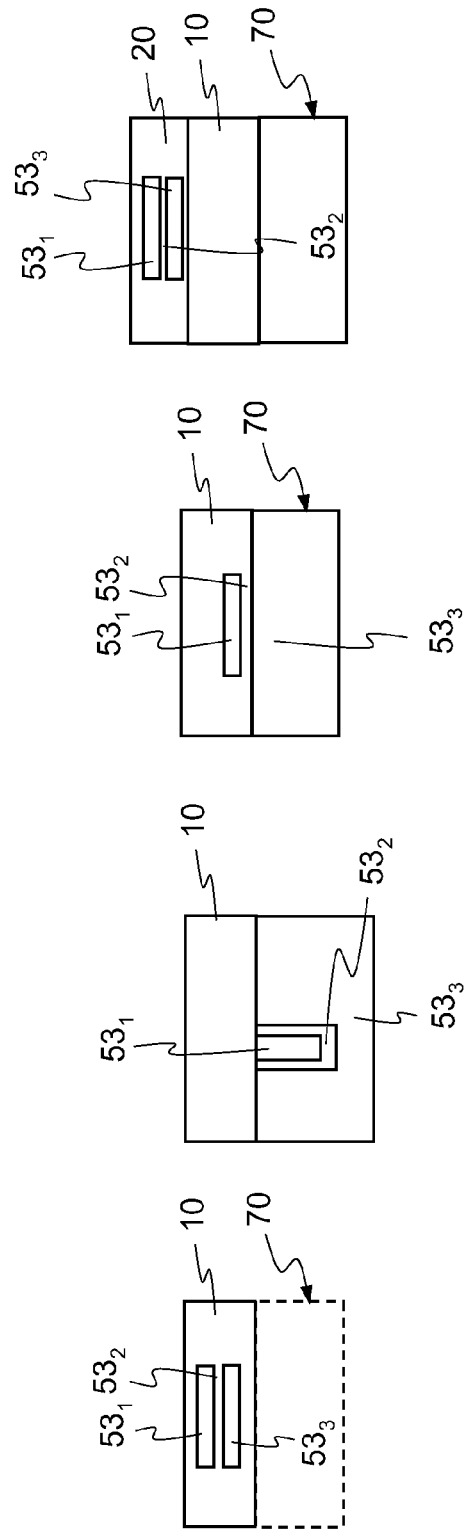
FIG 6
FIG 7A
FIG 7B
FIG 7C
FIG 7D

SEMICONDUCTOR COMPONENT INCLUDING A LATERAL TRANSISTOR COMPONENT

BACKGROUND

The present disclosure relates to a lateral semiconductor component, in one embodiment a power semiconductor component.

Power semiconductor components are components that, usually, have a lowly doped drift zone. If the component blocks a space charge region propagates in the drift zone, the drift zone therefore serving to absorb a blocking voltage, if the component blocks. To achieve a high voltage blocking capability the drift zone of a power semiconductor component includes a monocrystalline semiconductor material. A monocrystalline semiconductor material has low leakage currents if an electrical voltage is applied, and can, therefore, be dimensioned to have a high voltage blocking capability. However, monocrystalline semiconductor material is difficult to produce and by way of deposition processes can only be produced on a monocrystalline semiconductor material, but not on insulators, like an oxide or a glass.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 illustrates one embodiment of a semiconductor component arrangement having a lateral transistor component that is disposed on an electrically insulating carrier layer FIG. 2 illustrates one embodiment of a semiconductor component arrangement having a lateral transistor component.

FIG. 4 illustrates one embodiment of a semiconductor component arrangement having a lateral transistor component, and having further circuit components that are connected to the lateral transistor component.

FIG. 5 illustrates one embodiment of an electrical circuit diagram of the semiconductor component arrangement according to FIG. 4.

FIG. 6 illustrates one embodiment of a semiconductor component arrangement having a lateral transistor component, and having a control circuit for the transistor component, the control circuit being disposed in a substrate below the lateral transistor component.

FIG. 7 illustrates different alternatives for integrating a capacitive component of the control circuit.

DETAILED DESCRIPTION

Figure 3:
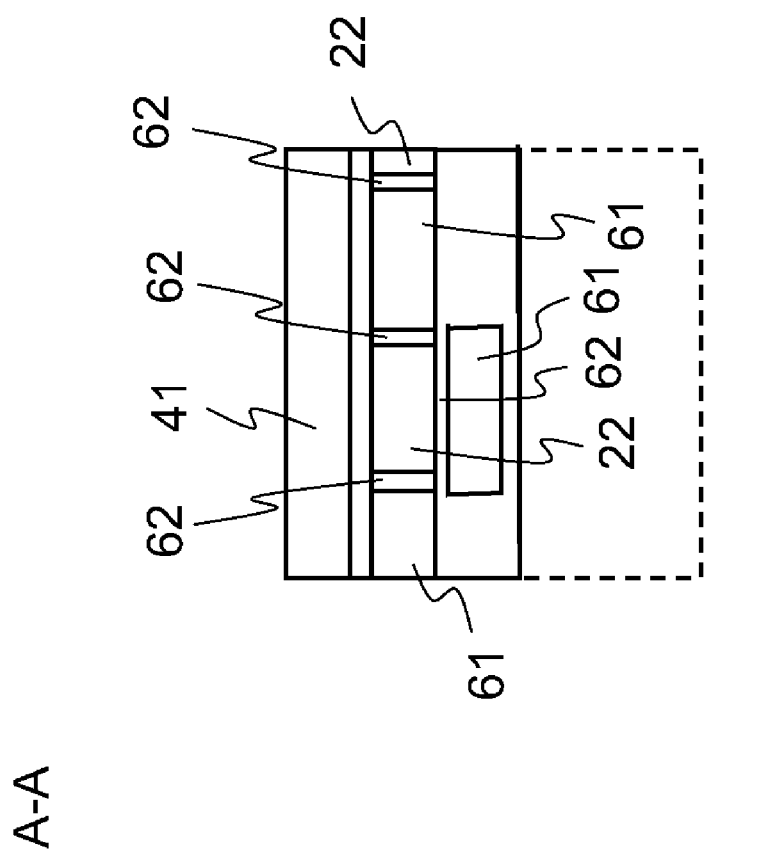
FIG. 3 illustrates one embodiment of a semiconductor component arrangement having a lateral transistor component.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides a semiconductor component having a lateral transistor component that includes: an electrically insulating carrier layer; on the carrier layer a first and a second semiconductor layer that are disposed one above another and that are separated from each other by a dielectric layer, and from which at least the first semiconductor layer includes a polycrystalline semiconductor material, an amorphous semiconductor material or an organic semiconductor material; in the first semiconductor layer: a source zone, a body zone, a drift zone and a drain zone; in the second semiconductor layer: a drift control zone being disposed adjacent to the drift zone, having a control terminal for applying a control potential at a first lateral end, and being coupled to the drain zone at a second lateral end via a rectifying element; a gate electrode being disposed adjacent to the body zone and being dielectrically insulated from the body zone by a gate dielectric layer.

FIGS. 1 and 2 illustrate a vertical cross section of one embodiment of a semiconductor component arrangement that includes a lateral transistor component. The semiconductor component arrangement includes an electrically insulating carrier layer 10, that, for example, may consist of an oxide, like a semiconductor oxide, or a glass. The carrier layer 10 may be arranged on a semiconductor substrate (illustrated in dashed lines) of, for example, silicon. However, the substrate 70 may be omitted, which is, for example, the case, if the carrier layer 10 is thick enough to provide for a sufficient mechanical stability of the semiconductor component arrangement. A first and a second semiconductor layer 20, 40 are arranged one above another on the carrier layer 10 and are dielectrically insulated from each other by a dielectric layer 30. At least the first 20 of these two semiconductor layers 20, 40 includes a polycrystalline semiconductor material, an amorphous semiconductor material or an organic semiconductor material, or is made thereof. Examples of organic semiconductor materials are polymers, fullerenes (C60), fullerene-derivates (C60MC120), pentacenes (C22H14), or, for example, n-decapentafluoroheptyl-methyl-naphthalene-1,4,5,8-tetracarboxylic diimide.

The second semiconductor layer, corresponding to the first semiconductor layer 20, may include a polycrystalline, an amorphous or an organic semiconductor material, or may consist thereof However, the second semiconductor layer may also include a monocrystalline semiconductor material. Conversely, the first semiconductor layer 20 may include a monocrystalline material, or may consist thereof, and the second semiconductor layer 40 may include a polycrystalline, an amorphous or an organic semiconductor material, or may consist thereof.

A polycrystalline semiconductor material is in connection with the present disclosure an inorganic semiconductor material, like silicon, that has several semiconductor crystals with corresponding grain boundaries between the semiconductor crystals. An amorphous semiconductor material is in connection with the present disclosure an inorganic semiconductor material having a heavier disordered crystal structure than a polycrystalline semiconductor material, and for a given volume therefore having more semiconductor crystals than a polycrystalline semiconductor material.

In the first semiconductor layer 20 component zones of a transistor component, which is a MOS transistor component according to the example, are arranged, namely: a source zone 21, a drain zone 24, a drift zone 23 adjoining the drain zone 24, and a body zone 22 arranged between the drift zone 23 and the source zone 21. In the example as illustrated the first semiconductor layer 20 is in a vertical direction of the semiconductor component arrangement arranged above the carrier layer 10. The source zone 21, the body zone 22, the drift zone 23, and the drain zone 24 are arranged adjacent to one another in a lateral direction of the semiconductor component arrangement.

In one embodiment illustrated the first semiconductor layer 20 is the one of the two semiconductor layer 20, 40 that is disposed nearest to the carrier layer 10, while the second semiconductor layer 40 is separated from the carrier layer 10 by the first semiconductor layer 20 and the dielectric layer 30. This order of arranging the first and second semiconductor layer 20, 40 above the carrier layer 10 can be changed (not illustrated). In this case the second semiconductor layer 40 lies closer to the carrier layer 10 than the first semiconductor layer 20.

Arranged adjacent to the body zone 22 is a gate electrode 61 that is dielectrically insulated from the body zone 22 by a gate dielectric layer 62. The gate electrode 61 serves to control a conducting channel in the body zone 22 between the source zone 21 and the drift zone 23. In one embodiment illustrated in FIG. 1 gate electrode 61 is arranged below the body zone 22 in a vertical direction and, in this example, is realized as a doped semiconductor zone within the semiconductor substrate 70.

Gate dielectric 62 may consist of the same material like carrier layer 10 and, however, can be thinner than carrier layer 10. Gate dielectric 62 in this example is formed by a locally thinner section of carrier layer 10. Producing such electrically insulating carrier layer 10 having a locally thinner section on a semiconductor substrate 70 may be performed in a conventional manner like, for example, by thermal oxidation of the semiconductor substrate 70. In the area in which the thinner gate dielectric layer 62 being thinner than the remaining carrier layer 10 is to be produced, during the oxidation process at least temporarily a protection layer, like a nitride layer, may be disposed upon the nitride layer protecting the areas of the semiconductor substrate below the nitride layer from being further oxidized. In this connection gate dielectric layer 62 may be produced by an oxidation or deposition process before producing the protection layer, or by an oxidation or deposition process after removing the protection layer. In one embodiment a thin dielectric layer, that has been produced before disposing the protection layer, may also be removed after removing the protection layer and may be replaced by a newly produced dielectric layer, the latter than forming the gate dielectric layer 62. This newly produced layer may be produced by an oxidation or deposition process.

One embodiment to the process described above the large area or full area carrier layer 10 may also be produced in that shallow trenches are etched into the semiconductor substrate 70 and are subsequently filled through a thermal oxidation or through a deposition processes. Structures formed in this way are also denoted as "shallow trench isolation" (STI). In this process the area of the gate dielectric 62 may be covered with a nitride layer before or after applying a gate dielectric, as disclosed above.

Realizing gate electrode or gate zone 61, respectively, to be a doped semiconductor zone within the semiconductor substrate 70 is only one of numerous different alternatives for realizing the gate electrode 61. Referring to FIG. 2 gate electrode 61 may, for example, be arranged within the carrier layer 61, the gate electrode 61 being dielectrically insulated from body zone 22 by a gate dielectric 62 in this case also. The gate electrode 61 arranged in the insulating carrier layer 10 may consist of a doped semiconductor material, a metal or another electrically conducting material. The gate electrode 61 arranged in the carrier layer 10 can be contacted at a position not illustrated in FIG. 2, which enables a control potential to be applied to gate electrode 61.

In one embodiment or additionally to arranging gate electrode 61 in a vertical direction below the body zone 22 the gate electrode may also be arranged in the same horizontal layer as the body zone 22 next to the body zone. FIG. 3 illustrates a cross section, in a vertical sectional plane A-A illustrated in FIG. 2, through a component having a gate electrode arranged in a horizontal direction next to the body zone 22. Illustrated in dashed lines is in FIG. 3 the body zone that according to FIG. 2 is arranged below the gate electrode

61. In the component of FIG. 3 the gate electrode 61 may be present optionally and additionally.

The MOS transistor component having the source zone 21, the body zone 22, the drift zone 23, and the drain zone 24 as well as the gate electrode 61, and the gate dielectric layer 62 arranged between the gate electrode 61 and the body zone 62, may be realized as an n-conducting component or a p-conducting component, a self-conducting (normally ON) or a self-blocking (normally OFF) component, and as an MOSFET or an IGBT. The conduction type of the component is governed by the doping type of the source zone 21, which in a n-conducting component is n-doped and in a p-conducting component is p-doped. In a self-blocking component body zone 22 is complementarily doped to source zone 21, i.e., in an n-conducting component body zone 22 is p-doped and in a p-conducting component is n-doped. In a self-conducting component body zone 22 is also complementarily doped to source zone 21, but has at least along the gate dielectric 62 a conducting channel that reaches from source zone 21 to the drift zone 23, that is from the same conduction type as source zone 21, and that already forms without a gate voltage being applied, i.e., at a potential difference of 0V between the electrical potentials of the gate electrode 61 and the body zone 22. This conducting channel can be produced by a doped section of the same conduction type as the source zone 21 or by fixed charges in the gate dielectric 62 or at an interface between the gate dielectric 62 and the gate electrode 61 or the body zone 22, or by suitable adjusted work differences between the material of the gate electrode 61 and the material of the body zone 22.

In an MOSFET the drain zone 24 is of the same conduction type as source zone 21 and in an IGBT is complementarily doped to the source zone 21. The drift zone 23 of the components illustrated in FIGS. 1 and 2 may be of the same conduction type as source zone 21, but may also be complementarily doped to the source zone. For a better understanding, as an example, an n-conducting and self-blocking MOSFET is now considered in detail. In this component source zone 21 is n-doped, body zone 22 is p-doped, drain zone 24 is n-doped, and drift zone 23 may be n-doped or p-doped as will be explained in the following. A p-conducting self-blocking MOSFET is obtained, if these component zones are doped complementarily to one another.

The second semiconductor layer 40 of the semiconductor component arrangement includes a drift control zone 42 that is arranged adjacent to drift zone 23. This drift control zone 42 includes at a first lateral end a control terminal 43 for applying a control potential. Optionally a connecting zone 41 (illustrated is dashed lines) is present between the control terminal 43 and the drift control zone 42. In the example as illustrated the first lateral end of the drift control zone 42 is the end of the control zone 42 that lies in the direction of body zone 22 and source zone 21, respectively. At a second lateral end the drift control zone 42 is at least locally coupled to drain zone 24 via a rectifying element 51. In one embodiment illustrated the second lateral end of the drift control zone is the end that lies in the direction of drain zone 24. At this second lateral end the component may include a further terminal zone 44 that is more highly doped than the drift control zone 42 and that may be of the same conduction type as the drain zone 24.

Drift control zone 42 is part of the MOS transistor component and serves to control a conducting channel in the drift zone 23 along dielectric layer 30 between the body zone 22 and the drain zone 24, if the component is driven in its on-state. In the following dielectric layer 30 will also be referred to as drift control zone dielectric of the MOS transistor component.

For controlling the conducting channel along the drift control zone dielectric 30 drift control zone 42 may assume an electrical potential that is different from the electrical potential of drain zone 24. Rectifying element 51, which is for example a bipolar diode or a Schottky diode, is polarized in such a way that at a conducting component it prevents discharging of the drift control zone 42 to the electrical potential of drain zone 24. The electrical potential that is required for forming the conducting channel along drift control zone dielectric 30 may be applied to the drift control zone 42 via control terminal 43.

The functionality of the lateral MOS transistor components illustrated in FIGS. 1 and 2 will in the following be explained for a first example, in which the transistor component is an n-conducting and self-blocking transistor component having an n-doped drift zone 23. This component conducts (is on), if a positive voltage is applied between drain zone 24 and source zone 21, and if a control potential is applied to the gate electrode 61 that is suitable for generating an inversion channel in the body zone 22 between source zone 21 and drift zone 23. This control potential is a positive electrical potential as compared to the electrical potential of source zone 21. Such a control potential of gate electrode 61 may be generated by a control circuit (not illustrated in FIGS. 1 and 2). At conducting component this control circuit further generates a control potential for control terminal 43, the control potential being selected such that an electrical potential of the drift control zone 42 lies above the electrical potential of drain zone 24. Through this an accumulation channel is formed in the drift zone 23 along a drift control dielectric 30 between body zone 22 and drain zone 24. This accumulation channel results in a significant reduction of the on-resistance of the component as compared to a similar component that does not have a drift control zone 42 or that does not have a suitable control potential applied to the drift control zone 42, respectively. Drift control zone 42 may be of the same conduction type as drift zone 23, however, drift zone 23 may also be complementarily doped.

If drift zone 42 is n-doped, and if the transistor component is an n-conducting component, p-charge carriers, i.e., holes, are required in the drift control zone 42 for forming an accumulation channel in the drift zone 23. These holes may, for example, be provided by a p-doped control terminal 41.

The n-conducting and self-blocking component that has been explained before blocks, if a positive voltage is applied between drain zone 24 and source zone 21, and if the electrical potential of gate electrode 61 is not sufficient for forming a conducting channel in the body zone 22. In this case a space charge region propagates in the drift zone 23 in the direction of the drain zone 24 starting from the pn-junction between body zone 22 and drift zone 23. The second lateral end of the drift control zone 42 via the rectifying element 51 lies approximately on drain potential. The doping concentration of drift control zone 42 is selected such that corresponding to the drift zone 23 a space charge region also propagates in the drift control zone 42 at blocking component. The electrical potential in the drift control zone 42 in the lateral direction then follows the electrical potential of the drift zone 23, resulting in only a slight voltage stress of the drift control dielectric 30 at blocking component. Therefore drift control dielectric 30 may be realized as a thin layer, which improves the accumulation effect, i.e., forming the accumulation channel in the drift zone 23 at conducting component.

The thickness of the drift control dielectric 30 lies, for example, in the range between 2 nm and 200 nm, and between 5 nm and 80 nm if inorganic semiconductor materials are used for the two semiconductor layers 20, 40 and between 2 nm and several μm if organic semiconductor materials are used for the two semiconductor layers 20, 40. The doping concentration of the drift control zone 42 lies, for example, in the range of the doping concentration of the drift zone 23. Depending on the desired voltage blocking capability of the component the net doping concentration of drift zone 23 is in the range between $10^{13}$(E13)cm$^{-3}$ and $2 \cdot 10^{16}$(2E16)cm$^{-3}$.

The net doping concentration can be reduced by compensation as compared to the acceptor and/or donator concentration of the drift zone 23 and/or the drift control zone 42. For this purpose semiconductor zones (not illustrated) that are complementarily doped to the doping of drift zone 23 or drift control zone 42 are arranged in the drift zone 23 or the drift control zone 42.

The doping concentrations of the source zone 21 and the drain zone 22 are, for example, in the range of the usual doping concentrations of source zones and drift zones in CMOS technology. These doping concentrations are, for example, between $10^{18}$(E18)cm$^{-3}$ and $10^{21}$(E21)cm$^{-3}$.

The doping of the connecting zone 42 should be sufficiently high in order to prevent punching through of an electrical field from the drift control zone 42 to terminal electrode 43.

If first semiconductor layer 20 with the drift zone 23 consists of a polycrystalline or an amorphous semiconductor material there is a higher charge carrier generation, or there are higher leakage currents in the drift zone 23 respectively, as this would be the case in a comparable component having a monocrystalline drift zone 23. These leakage currents are the higher the larger a cross-section of the drift zone 23 is. In the component illustrated in FIGS. 1 and 2 this cross section of the drift zone 23 is given by the dimension of the drift zone 23 in vertical direction and by the dimension of the drift zone 23 in a direction that is perpendicular to the plane of projection illustrated in FIGS. 1 and 2. The on-resistance and the on-conductivity of the components illustrated in FIGS. 1 and 2 is significantly determined by the conducting channel that forms along the drift control zone dielectric 30 at conducting component. For forming this conducting channel in the drift zone 23 already very small vertical dimensions of the drift zone 23, and therefore the first semiconductor layer 20, are sufficient, so that despite the use of an amorphous or polycrystalline semiconductor material for the drift zone 23 a component having a low on-resistance and low leakage currents and a high voltage blocking capability, respectively, may be realized. With the same on-resistance and the same voltage blocking capability like usual components the components as illustrated have a lower leakage current as compared to conventional polycrystalline or amorphous components, which is due to the lower volume. The dimensions of the drift zone 23 and the first semiconductor layer 20, respectively, in a vertical direction are, for example, lower than 250 nm, and lower than 100 nm.

If the drift zone 23 in an n-conducting and self-blocking MOSFET is p-doped, the functionality of this component is different from the functionality as explained before in that an inversion channel instead of an accumulation channel forms along the drift control zone dielectric, if the component conducts (is on). If the component blocks a space charge region propagates starting from a pn-junction which is then between drain zone 24 and drift zone 23.

A p-conducting component works equivalent to the n-conducting component as illustrated before, with the difference that the signs of the electrical potentials and voltages that have been explained before need to be inverted and, correspondingly, the polarity of the rectifying element 51 needs to be inverted.

As already explained, driving the MOS transistor component in its conducting or blocking state (switching on or switching off) is performed by applying a suitable control potential to the gate electrode 61, so that a conducting channel is formed in the body zone 22 between the source zone 21 and the drift zone 23. Further, at conducting component a control potential is applied to the control terminal 43 of drift control zone 42, which is suitable to form a conducting channel along the drift control dielectric 30 in the drift zone 23 between the body zone 22 and the drain zone 24. The gate potential may be generated by a usual control circuit or driver circuit for power semiconductor components. The drift control zone 42 may be controlled (driven) using the same control signal as gate electrode 61 via a control network.

An example of the control network is illustrated in FIG. 4 by way of an electrical circuit diagram. The control network includes a rectifying element 52, like, for example, a diode, that is connected between the gate electrode 61 or gate terminal G, respectively, of the transistor component, and the control terminal 43 of the drift control zone 42. The control network as illustrated further includes a capacitance like, for example, a capacitor, that is connected between the control terminal 43 and the source zone 21 of the MOS transistor component. The control network as illustrated is, in one embodiment, suitable for self-blocking MOS transistors and at conducting component causes the drift zone 42 to have at least approximately the same electrical potential as the gate electrode 61. Assuming that the voltage drop across the drift zone 23 or the drain-source-voltage of the conducting MOS transistor, respectively, is lower than its gate-source voltage, than the gate potential applied to the drift zone 42 is sufficient for forming an accumulation or inversion channel in the drift zone 43 along the drift control zone dielectric 30. If the component blocks, i.e., if the gate-source-voltage is, for example, set to zero, the conducting channel in the body zone 22 and correspondingly the conducting channel in the drift zone 23 is interrupted. The charge carriers that have before been presents in the drift control zone 42 and that are required for forming the accumulation or inversion channel are then shifted to the capacitive component 53, which serves as a temporary storage for these charge carriers until the MOS transistor component is switched on the next time.

By temporarily storing the charge carriers from the drift control zone 42 losses can be reduced, particularly if the component is driven in its on state or off state in a clocked fashion. A control or driver circuit only has to supply the amount of charge carriers to the control network of the drift control zone 42 that are lost through leakage currents. If the component is again driven in its on-state charge carriers that have before been stored in the storage capacitor 53 are shifted to the drift zone 43, where they serve to control the conducting channel in the drift zone 23 along the drift control zone dielectric 30.

Referring to FIG. 4 it should be noted that the control network for the drift control zone that is illustrated there is a control network for a self-blocking n-conducting MOS transistor, that conducts by applying a positive gate-source-voltage. This control network by inverting the polarity of the rectifying element 53 may easily be modified for the control of a p-conducting MOS transistor.

Optionally the control network includes a voltage limiting element, which, for example, is a further rectifying element and which is connected between the control terminal 43 of the drift control zone 42 and the source zone 21. In one embodiment illustrated voltage limiting element 54 is polarized such that an excessive rising of the potential of the drift zone 42 above the potential of the source zone 21 is prevented. Such rising of the potential of the drift zone 42 far above the potential of the source zone 21 could, for example, be caused by leakage currents and charge carrier generation, respectively, if the component is blocked for a longer period. In a control network for a p-conducting MOS transistor the polarity of this voltage limiting element 45 is to be inverted correspondingly.

It should be noted that the control network is optional and may be omitted, where in this case the control terminal 43 of the drift control zone is, for example, connected to a fixed voltage source or directly to the gate terminal G. However, in case of a direct connection to the gate terminal G increased losses would be present, because with every switch-on cycle the drift control zone 42 has to be completely charged by the control or driver circuit.

The MOS transistor component of the explained semiconductor component arrangement is, for example, suitable as a switch for switching an electrical load. In order to illustrate this FIG. 5 illustrates an electrical circuit diagram of the MOS transistor component together with the control network for the drift control zone as illustrated in connection with FIG. 4. Reference sign 1 in FIG. 5 denotes the circuit symbol of the MOS transistor component. This circuit symbol is similar to the circuit symbol for a MOSFET, an n-conducting self-blocking MOSFET in the present example, and besides the gate terminal G includes a further control terminal, namely control terminal 43 for the drift control zone. The MOS transistor component together with the control network may be controlled like a usual MOSFET and may be used for switching an electrical load. For this purpose the load, as illustrated in FIG. 5, is connected in series to the drain-source-path of the MOS transistor component between terminals for a positive supply potential V+ and a negative supply potential or reference potential GND, respectively. As explained the optional control network is connected between the gate terminal G and the source terminal S and the control terminal 43 for the drift control zone.

Reference sign 81 in FIG. 5 denotes a control or driver circuit for the MOS transistor component. This control or driver circuit may be a conventional control or driver circuit for a MOSFET, in one embodiment a power MOSFET. Referring to FIG. 6 control or driver circuit 81 may be integrated in the semiconductor substrate 70. The control or driver circuit, which is only schematically illustrated in FIG. 6, may be realized in a conventional manner and may, for example, include transistors and current sources. The control or driver circuit 81 is electrically connected to the gate electrode 61. A line connection between the control or driver circuit 81 and the gate electrode 61 is schematically illustrated in FIG. 6.

In a corresponding manner like the control or driver circuit 81 also the circuit components of the control network may be integrated in the semiconductor substrate 70. In this case the capacitive storage element 53 may be realized as a plate capacitor in the carrier layer 10 above the semiconductor substrate 70, which is schematically illustrated in FIG. 7A. The storage element 53 in this case includes at least two plate-shaped areas $53_1$, $53_2$ of an electrically conducting material that act as capacitor plates, that are arranged adjacent to one another and that are separated by a section $53_2$ of the carrier layer 10 from one another. The section $53_2$ of the carrier layer 10 forms the capacitor dielectric.

In one embodiment the capacitive storage element 53 may be realized as a trench capacitor in the semiconductor substrate 70 which is schematically illustrated in FIG. 7B. In this case the semiconductor substrate 70 forms one $53_3$ of the two electrodes $53_1$, $53_2$ of the storage element 53.

In one embodiment, illustrated in FIG. 7C, one of the two electrodes of the capacitive storage element is arranged in the carrier layer 10. The other electrode $53_3$ is formed by the substrate 70. The dielectric $53_2$ is formed by a section of the carrier layer 10. This section being arranged between the first electrode $53_2$ and the substrate.

Referring to FIG. 7D the capacitive storage element 53 with the two electrodes $53_1$, $53_3$ and the dielectric $53_2$ may also be arranged in one of the two semiconductor layers, like, for example, the first semiconductor layer 20.

Further semiconductor components or integrated circuits (not illustrated) may be arranged in the semiconductor substrate 70 or the semiconductor layers 20, 40. These semiconductor components are, for example, logic components, i.e., components that, other than power components, do not have a high voltage blocking capability. The logic components within a semiconductor substrate 70 may be realized using conventional technologies for producing integrated circuits. Producing the semiconductor component on a semiconductor substrate 70 having logic components requires only some few additional process steps, namely an oxidation of the semiconductor substrate 70 for producing the carrier layer 10, depositing the first semiconductor layer 20, producing the doped semiconductor zones in the first semiconductor layer 20, producing the drift control zone dielectric 30 on the first semiconductor layer 20, and producing the second semiconductor layer 40 on the drift control zone dielectric 30 and of the doped zones 41, 42 within this second semiconductor layer 40. A polycrystalline, amorphous or an organic semiconductor material, from which the first semiconductor layer 20 consists of, can be deposited easily on the electrically insulating carrier layer 10. The same applies to the second semiconductor layer 40, if it consists of a polycrystalline, an amorphous or an organic semiconductor material. Such material can easily be deposited on the drift control zone dielectric 30. Drift control zone dielectric 30 is, for example, an oxide, that is deposited on the first semiconductor layer 20, or that is produced by oxidizing an area close to the surface of the first semiconductor layer 20. An oxidation close to the surface is, in one embodiment, suitable in connection with a polycrystalline or an amorphous inorganic semiconductor material, like, for example, silicon.

Figure 8:
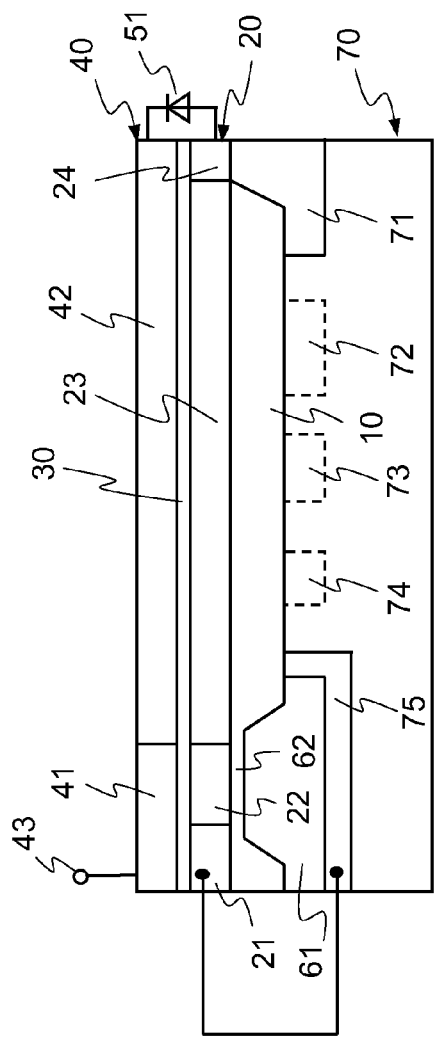
FIG. 8 illustrates one embodiment of a semiconductor component arrangement having a modified transistor component as compared to the transistor component in FIGS. 1 and 2.

If the MOS transistor component is driven in its off state the voltage applied between the drain zone 24 and the source zone 21 essentially drops across the drift zone 23 and drift control zone 42. The maximum tolerable voltage, i.e., the voltage blocking capability of the component, is in this connection dependent on the net doping and the dimensions of the drift zone 23 and the drift control zone 42 in a lateral direction. This voltage blocking capability may be several 10V up to 100V or even several kV. The semiconductor substrate 70 below the drift zone 23 lies for example on a given electrical potential, like ground. The voltage difference between the electrical potential of the drift zone 23 and this electrical potential of the semiconductor substrate 70 at blocking component is present across the electrically insulating carrier layer 10. FIG. 8 illustrates a cross section of an example of a lateral power semiconductor component in which the voltage stress of the electrically insulating carrier layer is reduced as compared to the components explained above.

This is obtained by arranging a doped semiconductor zone 71 in the substrate 70 below the drain zone, the semiconductor zone 71 being significantly higher doped than the basic doping of the semiconductor substrate and adjoining the drain zone 24. In the region below the source zone 21 a further doped semiconductor zone 72 is present in the semiconductor substrate 70, the further doped semiconductor zone 75 being complementarily doped to the basic doping of the semiconductor substrate 70 being dielectrically insulated against the gate electrode 61, and being connected to the source zone 21. The dopings of the first semiconductor zones 71 and the basic doping of the semiconductor substrate 70 are selected such that a pn-junction formed between the first semiconductor zone 71 and remaining regions of the semiconductor substrate 70 is always biased in its forward direction.

The dopings of the further semiconductor zone 75 and the basic doping on the semiconductor substrate 70 are selected such that a pn-junction formed between the semiconductor zone 75 and remaining regions of the semiconductor substrate is always biased in a reverse direction (blocking direction). If the drain zone 24 at usual operation of the transistor component has an electrical potential that is above a potential of the source region 21, the basic doping of the semiconductor substrate is a low n-doping, and the doping of the further semiconductor zone 75 is a p-doping. If the electrical potential of the drain zone at operation of the transistor component is always below the electrical component of the source region 25, these dopings have to be inverted correspondingly.

Below the electrically insulating carrier layer 10 additionally one or more further semiconductor zones 72, 73, 74 are arranged in the semiconductor substrate, these semiconductor zones being doped complementarily to the basic doping of the semiconductor substrate 70, adjoin the insulation layer 10, and are arranged distant to one another and distant to the first semiconductor zone 71 and the further semiconductor zone 75. The functionality of this arrangement with the first semiconductor zone 71 and the at least one further semiconductor zone 72, 73, 74 will now shortly be explained: If the component blocks starting from the pn-junction between the further semiconductor zone 75 and the region of the semiconductor substrate 70 that surrounds the further semiconductor zone 75 a space charge region propagates in the semiconductor substrate 70, the space charge region with increasing voltage difference between the electrical potential of the drain zone 24 and the electrical potential of the semiconductor substrate 70 first reaches the further semiconductor zone 75 that is arranged closest to the further semiconductor zone 75, and with further increasing voltage difference reaches further semiconductor zones 72, 73 (illustrated in dashed lines) that are optionally present. Through this the further semiconductor zones 72, 73, 74 at blocking component have electrical potentials that are different from the electrical potential of the drain zone 24, and that lie in the range of the electrical potentials the drift zone 23 has in those regions that lie opposite to the further semiconductor zones 72, 73, 74. In this way the voltage stress of the insulating layer 10 is reduced. The further semiconductor zones 72, 73, 74 may be doped so high that they can not be completely depleted. However, in one embodiment the doping of these semiconductor zones 72, 73, 74 may be configured to the doping of the surrounding semiconductor substrate 70 in such a manner that they are completely depleted at blocking component.

Figure 9:
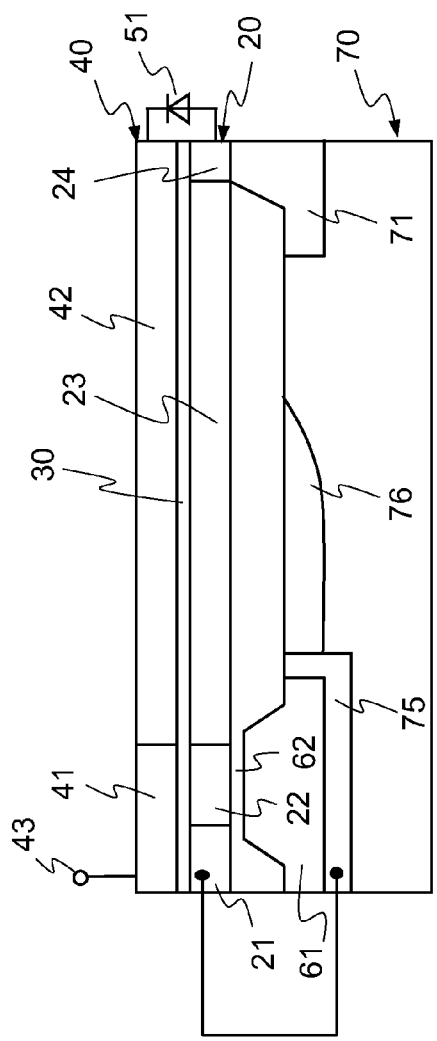
FIG. 9 illustrates one embodiment of a semiconductor component arrangement having a modified transistor component as compared to the transistor component in FIGS. 1 and 2.

Instead of the highly doped semiconductor zones 72, 72, 74, referring to FIG. 9, in one embodiment a single semiconductor zone 76 can be arranged in the substrate, this semiconductor zone 76 adjoining the further semiconductor zone 75 and having a doping concentration that decreases in a lateral direction in the direction of the drain zone 24. Such a semiconductor zone 76 is also referred to as VLD zone (VLD=variation of lateral doping).

Figure 10:
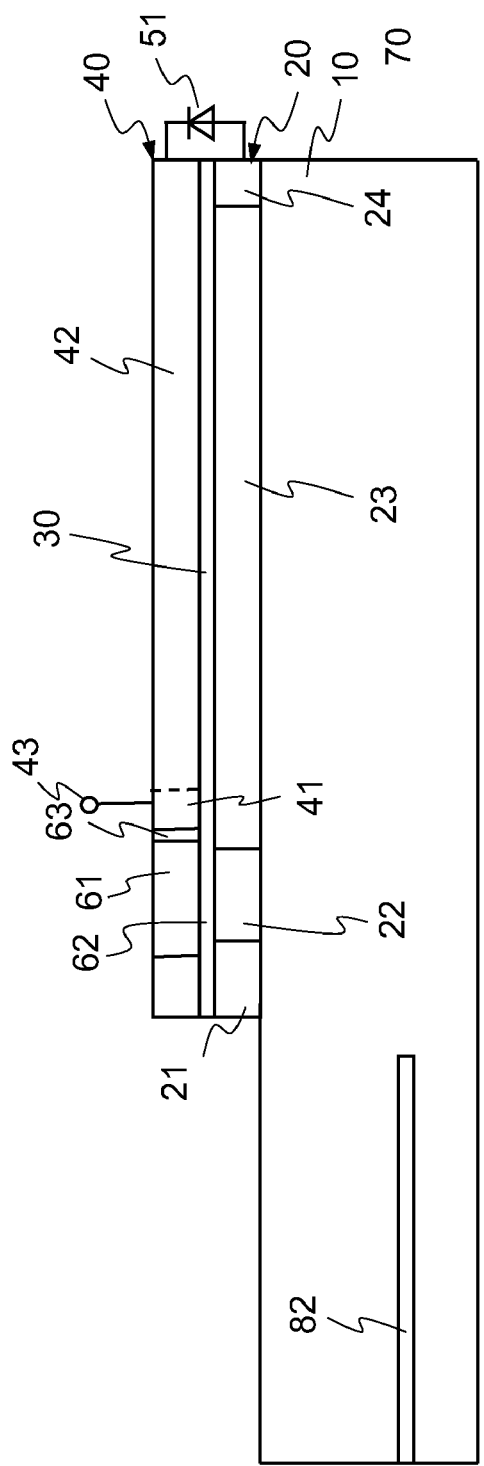
FIG. 10 illustrates one embodiment of a semiconductor component arrangement having a lateral transistor component, and having thin film components being disposed in the carrier layer below the transistor component.

In one or more embodiments discussed so far gate electrode 61 is arranged in a substrate below carrier layer 10 (see FIGS. 1, 4 and 6) or in the carrier layer 10 (see FIG. 2). However, arranging the gate electrode 61 adjacent to body zone 22 in this manner is only an example. Referring to FIG. 10 gate electrode 61 may, for example, be arranged within the second semiconductor layer 40 adjacent to the body zone 22. The dielectric layer 30 between the first and second semiconductor layer 20, 40 in this component has two functions: first, it serves as a gate dielectric layer 62 in this area in which the gate electrode 61 and the body zone 22 are arranged adjacent to one another; and it serves as a drift control zone dielectric in the region in which the drift control zone 42 and the drift zone 23 are arranged adjacent to one another. In this component gate electrode 61 by insulating layer 63 is insulated in a lateral direction from the drift control zone 42 and from the terminal zone 41, the terminal zone 41 adjoins the drift control zone 42 and being optionally.

Figure 11:
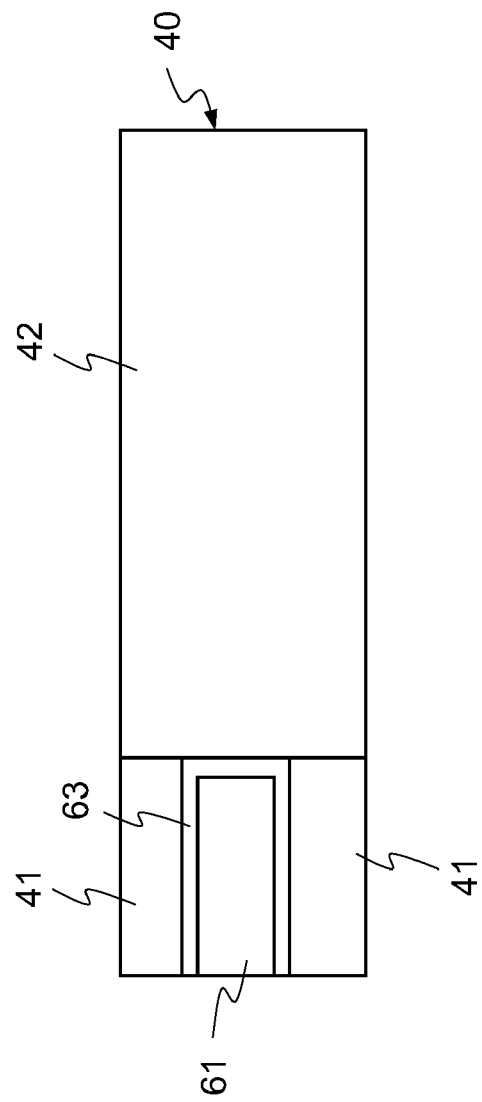
FIG. 11 illustrates one embodiment of a top view of a component that is modified as compared to the component in FIG. 10.

FIG. 11 illustrates a top view at the second semiconductor layer 40 or a lateral cross section through this semiconductor layer 40 a semiconductor component that is modified as compared to the component according to FIG. 10. In this component the terminal zone 41 of the drift control zone 42 is arranged adjacent to the gate electrode 61 in a direction perpendicular to the current flow direction and is insulated from the gate electrode 61 by insulating layer 63. Further, in this component gate electrode 61 is arranged adjacent to the body zone 22 (not illustrated in FIG. 11) in a vertical direction and in a way corresponding to the illustration in FIG. 10. In this component gate electrode 61 may include several gate electrode sections that are connected to a common gate terminal (not illustrated in FIG. 11) and that are arranged alternatingly with sections of the terminal zone 41 in a direction perpendicular to the current flow direction. In the component of FIG. 11 terminal zone 41 of the drift control zone in a vertical direction is arranged above source zone 21.

The alternatives for arranging the gate electrode 61 that have been discussed so far may be used arbitrarily, i.e., in each of the components discussed before any of the alternatives for realizing the gate electrode 61 may be applied. In this connection it should be noted that the order of the first and second semiconductor layers 20, 40 on carrier layer 10 is only an example. This order can be interchanged, i.e., the second semiconductor layer 40 can be arranged on the carrier layer 10, and the first semiconductor layer 20 can then be arranged on the drift control dielectric 30 above the second semiconductor layer 40.

The MOS transistor component discussed above that has the two semiconductor layers, from which at least the semiconductor layer that includes the drift zone 23 includes a polycrystalline, amorphous or inorganic semiconductor material, or consists thereof, and that are arranged on an electrically insulating carrier layer 10, can be arranged on any carrier. Referring to FIGS. 1 to 4 and 6 to 8 the carrier is, for example, a semiconductor substrate 70, on which the electrically insulating carrier layer 10 is arranged. Referring to FIG. 10 the electrically insulating carrier layer may be realized in such a way that it functions as a carrier, i.e., has a sufficient mechanical stability. The thickness of the carrier layer 10 on the semiconductor substrate 70 is, for example, between 100 nm and 5 μm. In one embodiment illustrated in FIG. 10, in which the insulating carrier layer 10 is a carrier itself, its thickness is, for example, between 20 μm and 1000 μm, or more.

In this electrically insulating carrier layer 10 that acts as a carrier thin film components 82 may be integrated, which are only schematically illustrated in FIG. 6. These thin film components are, for example thin film transistors (TFT), like they are used in so called TFT displays, for example. The explained MOS transistor component may, for example, be arranged on a glass carrier of a TFT display. This power component may be part of a driver circuit for the thin film components, but may also be part of a voltage supply circuit of the thin film components, like, for example, a voltage converter.

The explained component concept that includes providing a first semiconductor layer 20 having a drift zone, a second semiconductor layer 40 having a drift control zone, and a drift control zone dielectric 30 between the drift zone 23 and the drift zone 42, and in which the first semiconductor layer 20 includes a monocrystalline, polycrystalline or amorphous inorganic semiconductor material or an organic semiconductor material, or consists thereof, is not limited to MOS transistors. Referring to FIG. 8 this concept may also be applied to Schottky diodes. A Schottky diode is essentially different from the MOS transistors explained before in that it does not include a gate electrode and in that instead of the source and body zone a Schottky zone 25 is present, the Schottky zone 25 adjoining the drift zone 23 and forming a Schottky-junction with drift zone 23. Schottky zone 25 consists of a suitable Schottky material like, for example, aluminum, platinum, or gold. Schottky zone 25 forms an anode zone of the Schottky diode. The Schottky diode further includes a component zone that joins the drift zone 23, that is more highly doped than the drift zone 23, and the function of which corresponds to the function of the drain zone in MOS transistor components.

Figure 12:
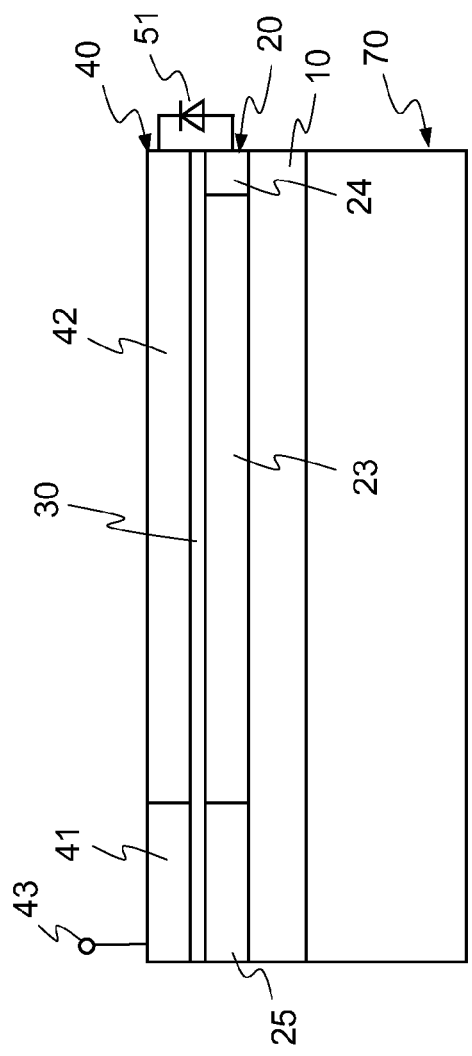
FIG. 12 illustrates one embodiment of a semiconductor component arrangement having a diode component that is disposed on a carrier layer.

This component zone forms a cathode zone and in FIG. 12 has the same reference sign as the drain zone 24 explained before. If an organic semiconductor material is used zone 24 may be a Schottky metal zone or a conducting; quasi-metallic—organic material like, for example PEDOT (polyethylenedioxythiophene) doped with PSS (polystyenesulfonate). For the rest the configuration of the power semiconductor component including the Schottky diode corresponds to the configuration of the MOS transistors discussed above. In this component also a rectifying element 51 is present between the cathode zone 24 and the drift zone 42, the rectifying element at conducting component prevents discharging the drift control zone 42 in the direction of the cathode zone 24. The Schottky diode as illustrated conducts and blocks depending on the polarity of a voltage applied between the anode zone 25 and the cathode zone 24, where at conducting component its on-resistance may significantly be reduced by suitable controlling the drift control zone 42. For a component having an n-doped drift zone 23 an electrical potential is to be applied to the drift control zone 42 that lies above the electrical potential of the drift zone 23.

Regarding the "body" of the Schottky power semiconductor component the explanations then have been made before apply correspondingly. In the example according to FIG. 10 this body is formed by a semiconductor substrate 70 below the electrically insulating carrier layer 10. However, this body may be realized in any other way discussed so far.

FIGS. 13 to 16 illustrate further embodiments of semiconductor components that each include a transistor component having a drift zone 23, a drift control zone 42 as well as a gate electrode 61. In the semiconductor component arrangement illustrated in FIG. 13 gate electrode 61 and drift control zone 42 are arranged in a substrate. This substrate may, for example, be a semiconductor substrate, like, for example, a silicon substrate a SOI substrate, a glass substrate, or a substrate of an organic carrier material. Examples for an organic carrier material are films (foils) made of Mylar® (BOPET), polystyrene or polyester. Gate electrode 61, which in this case is, for example, made of gold or a conducting organic material, like PEDOT (polyethylenedioxythiophene) doped with PSS (polystyenesulfonate), and the drift control zone 42 adjoin one another in a lateral direction in the example as illustrated. In a manner not illustrated in detail gate electrode 61 and drift control zone 42 may be dielectrically insulated from one another. In this connection it should be noted that gate electrode 61 and drift control zone 42 may be controlled independent from one another or may have electrical control potentials that are independent from one another at conducting component, respectively.

Figure 13:
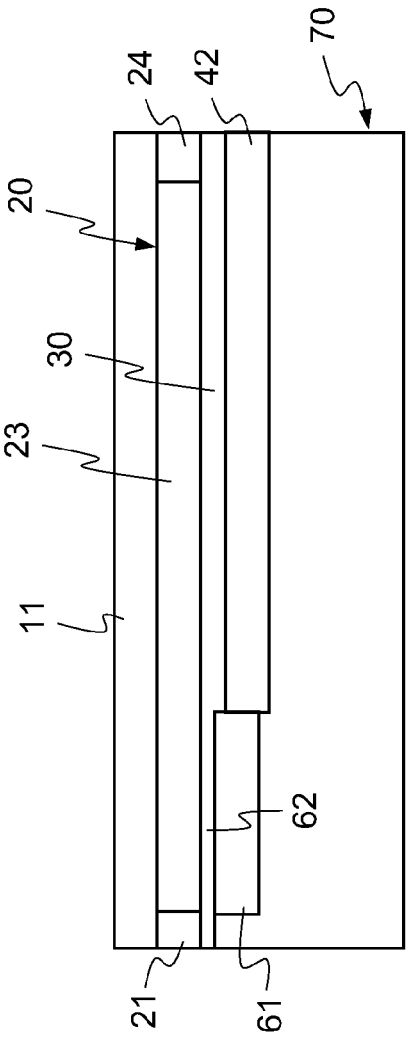
FIG. 13 illustrates one embodiment of a semiconductor component arrangement having a transistor component that includes a drift zone and a drift control zone, and that has its drift control zone arranged in a substrate.

In the component illustrated in FIG. 13 gate dielectric 62 and drift control zone dielectric 30 adjoin one another in a lateral direction and may consist of the same material. Gate dielectric 62 and drift control zone dielectric 30 may have the same thickness, but may also have different thicknesses—as illustrated in FIG. 13. Suitable materials for these dielectrics are, for example, PMMA (polymethylmethacrylate), polyimide or BZT (barium zirconate titanate) if organic semiconductor materials are used. In the example as illustrated drift control zone dielectric is thicker than the gate dielectric. However, this is only an example. Gate dielectric 62 could also be thicker than drift control zone dielectric 30. The thickness of these two dielectrics 63, 30 is dependent on the control potential that is applied to the gate electrode 61 conducting component. Generally the following applies: for forming a conducting channel along gate electrode 61 or drift control zone 42, respectively, the dielectric layer may be the higher the higher the applied control potential is.

The layer 20, in which the drift zone 23 is realized, may, in one embodiment, consist of one or several stacked or co-deposited organic semiconductor materials ("hetero junction", like C60 of pentacene) reference signs 21 and 24 denote source zones and drain zones of the transistor component which, in one embodiment, are realized such that they form a Schottky-junction to the drift control zone 23. A body zone is not present in this component. The organic semiconductor material (which may be of an n- or a p-type) in general has a high specific resistance that may result in an "accumulation state" if a gate-source-voltage is applied, and in which a conducting channel forms a long gate electrode 61 and the drift control zone 42, contributing in a reduction of the on-resistance.

Above the layer 20 that includes the drift zone 23 optionally an insulating layer 11 is present, which, for example, consists of PMMA (polymethylmethacrylate), or a polyimide.

Figure 14:
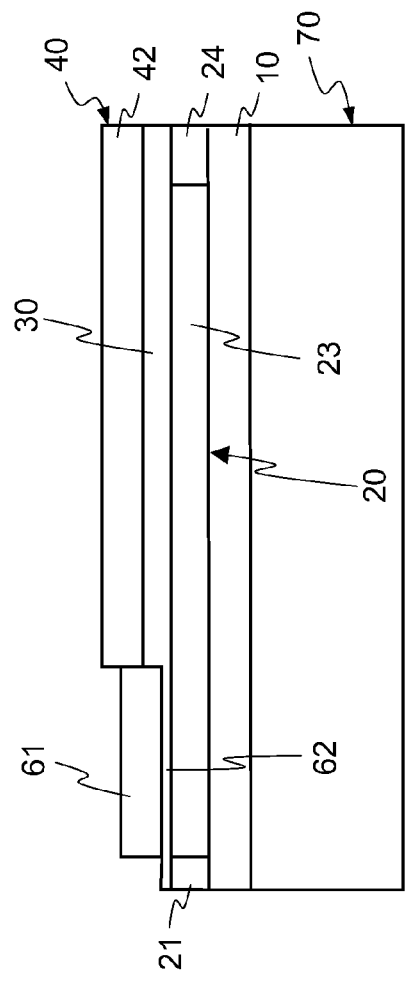
FIG. 14 illustrates one embodiment of a semiconductor component arrangement that is modified as compared to the semiconductor component arrangement according to FIG. 13 and that has its drift control zone arranged above the drift zone.

FIG. 14 illustrates a semiconductor component arrangement that is modified as compared to the semiconductor component arrangement in FIG. 13. In the semiconductor component arrangement illustrated in FIG. 14 the gate electrode 61 and the drift control zone 42 are arranged above the drift zone 23. The explanations made so far concerning the thickness of the gate dielectric 62 and the drift control zone dielectric 30 apply to the component illustrated in FIG. 14 accordingly. The layer 20 including the drift zone 23 is arranged above an insulating layer 10, the insulating layer 10 optionally being arranged on a substrate 70. The substrate 70 may, for example, be omitted, if the carrier layer 10 is so thick that it provides a sufficient mechanical stability of the arrangement.

Figure 15:
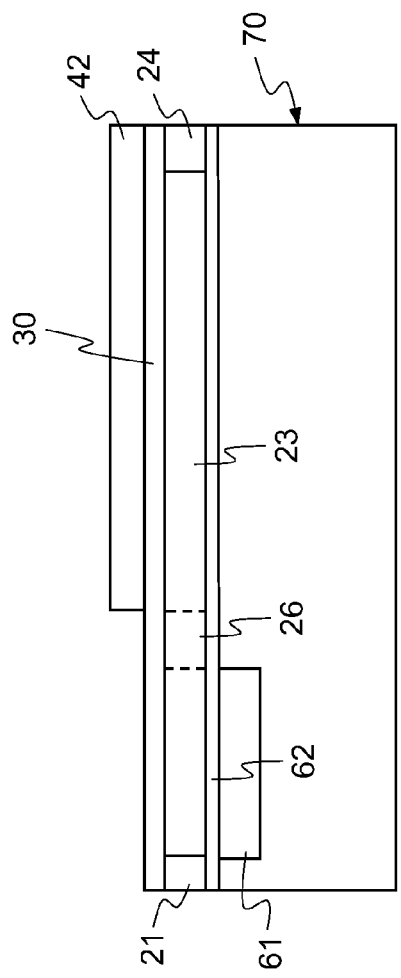
FIG. 15 illustrates one embodiment of a semiconductor component arrangement having a transistor component that includes a drift zone, a drift control zone and a gate electrode, and that has the gate electrode and the drift control zone arranged at opposed sides of the drift zone.

In the component illustrated in FIG. 15 gate electrode 61 and drift control zone 42 are arranged on opposed sides of the drift zone 23 in a vertical direction. In the example as illustrated the gate electrode 61 is arranged in a substrate, while the drift control zone 42 is arranged above the drift zone 23. The positions of the gate electrode 61 and the drift control zone 42 may be interchanged (not illustrated). In the same way as in the components explained before in the component illustrated in FIG. 15 in a conducting state also two conducting channels are formed: a first conducting channel in the semiconducting layer 20 along the gate electrode 61; and a second conducting channel in the semiconducting layer 20 along the drift control zone 42. In the component illustrated in FIG. 15 these two conducting channels are formed at sides of the semiconductor layer 20 that oppose each other in the vertical direction. In order to connect these two conducting channels electrically with one another an optional connection zone 26 is present, which, for example is made of a Schottky metal or a conducting "quasi-metallic" polymer, like PEDOT (polyethylenedioxythiophene) doped with PSS (polystyenesulfonate), the connection layer being arranged in a transmission region between the gate electrode 61 and the drift control zone 42 in the semiconductor layer 20.

Figure 16:
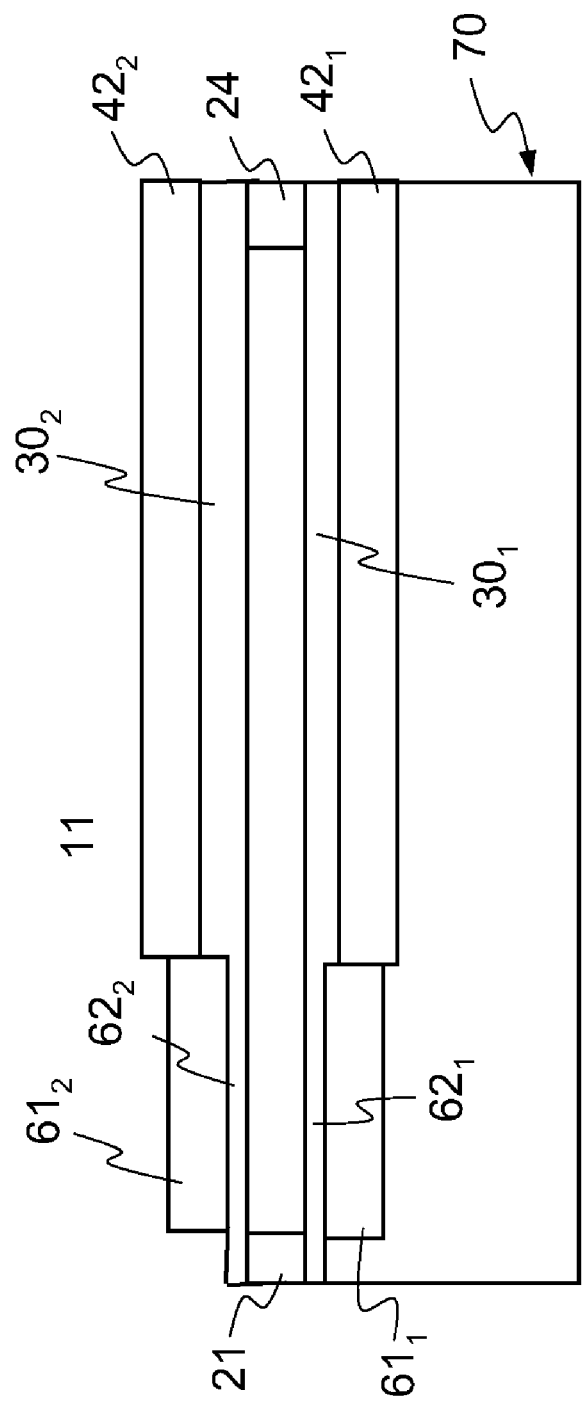
FIG. 16 illustrates one embodiment of a semiconductor component arrangement having a transistor component that includes a drift zone as well as two drift control zones and two gate electrodes.

The component illustrated in FIG. 16 is a combination of the two components illustrated in FIGS. 13 and 14. This component includes two gate electrodes $61_1$, $61_2$ and two drift control zones $42_1$, $42_2$ that are arranged above and below the semiconductor layer 20 that includes the drift zone 23. Between the gate electrodes $61_1$, $61_2$ and the drift control zones $42_1$, $42_2$ gate dielectrics $61_1$, $61_2$ and drift control zone dielectrics $30_1$, $30_2$ are present. Finally it should be noted that gate electrode 61 and/or drift control zone terminal 42 may consist of a semiconducting or conducting organic material or a metal if an organic semiconductor material is used for the first semiconductor layer 20.

It should further be noted that features that have been explained in connection with one example may be combined with features of other examples even in those cases in which this is not explicitly been mentioned.

One embodiment relates to a semiconductor component arrangement having a lateral transistor component that includes: an electrically insulating carrier layer having a thickness of more than 20 μm; on the carrier layer a first and a second semiconductor layer that are disposed one above another and that are separated from each other by a dielectric layer; in the first semiconductor layer: a source zone, a body zone, a drift zone and a drain zone; in the second semiconductor layer: a drift control zone being disposed adjacent to the drift zone, having a control terminal for applying a control potential at a first lateral end, and being coupled to the drain zone at a second lateral end via a rectifying element; a gate electrode being disposed adjacent to the body zone and being dielectrically insulated from the body zone by a gate dielectric layer.

One embodiment relates to a semiconductor component, including: a first and a second semiconductor layer being disposed adjacent to each other and being separated from each other by a dielectric layer, and from which at least the first semiconductor layer includes a polycrystalline semiconductor layer, an amorphous semiconductor layer or an organic semiconductor layer; in the first semiconductor layer: a source zone, a body zone, a drift zone and a drain zone; in the second semiconductor layer: a drift control zone being disposed adjacent to the drift zone, having a control terminal for applying a control potential at a first lateral end, and being coupled to the drain zone at a second lateral end via a rectifying element; a gate electrode being disposed adjacent to the body zone, and being dielectrically insulated from the body zone by a gate dielectric layer.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component arrangement having a lateral transistor component, comprising:
   an electrically insulating carrier layer;
   a first and a second semiconductor layer arranged above another on the carrier layer and separated from another by a dielectric layer, the first semiconductor layer at least comprising a polycrystalline semiconductor material, an amorphous semiconductor material or an organic semiconductor material;
   a source zone, a body zone, a drift zone and a drain zone in the first semiconductor layer;
   a drift control zone in the second semiconductor layer, being arranged adjacent to the drift zone, comprising a control terminal at a first lateral end for applying a control potential, and being coupled to the drain zone via a rectifying element at a second lateral end; and
   a gate electrode, being arranged adjacent to the body zone, and being dielectrically insulated from the body zone by a gate dielectric layer,
   wherein the carrier layer is arranged on a semiconductor body, and in which further semiconductor components are arranged in the semiconductor body, these components being connected to the gate electrode, the source zone or the drain zone of the lateral transistor component.

2. A semiconductor component arrangement having a lateral transistor component, comprising:
   an electrically insulating carrier layer;
   a first and a second semiconductor layer arranged above another on the carrier layer and separated from another by a dielectric layer, the first semiconductor layer at least comprising a polycrystalline semiconductor material, an amorphous semiconductor material or an organic semiconductor material;
   a source zone, a body zone, a drift zone and a drain zone in the first semiconductor layer;
   a drift control zone in the second semiconductor layer, being arranged adjacent to the drift zone, comprising a control terminal at a first lateral end for applying a control potential, and being coupled to the drain zone via a rectifying element at a second lateral end; and
   a gate electrode, being arranged adjacent to the body zone, and being dielectrically insulated from the body zone by a gate dielectric layer,
   wherein thin film components are integrated in the carrier layer, the thin film component being connected to the gate electrode, the source zone or the drain zone of the lateral transistor component.

3. The arrangement of claim 1, wherein the second semiconductor layer comprises a polycrystalline or amorphous semiconductor material, or an inorganic semiconductor material.

4. The arrangement of claim 1, comprising wherein the rectifying element is polarized such that at blocking transistor component electrically discharging of the drift control zone to an electrical potential of the drain zone is prevented.

5. The arrangement of claim 1, comprising wherein a capacitive storage element is connected to the control terminal of the drift control zone.

6. The arrangement of claim 1, comprising wherein the control terminal of the drift control zone is coupled to the gate electrode wire a rectifying element.

7. A semiconductor component arrangement having a lateral transistor component, comprising:

an electrically insulating carrier layer having a thickness of more than 100 nm;

on the carrier layer a first and a second semiconductor layer, being arranged one above another and being separated from one another by a dielectric layer;

in the first semiconductor layer: a source zone, a body zone, a drift zone, and a drain zone;

in the second semiconductor layer: a drift control zone, being arranged adjacent to the drift zone, comprising a control terminal for applying a control potential at a first lateral end; and being coupled to the drain zone via a rectifying element at a second lateral end; and a gate electrode, being arranged adjacent to the body zone, and being dielectrically insulated from the body zone by a gate dielectric layer.

8. The arrangement of claim 7, wherein the carrier layer comprises a glass.

9. A semiconductor component, comprising:

a first and a second semiconductor layer, being arranged adjacent to one another and being separated from one another by a dielectric layer, and from which at least the first semiconductor layer comprises a polycrystalline semiconductor material and amorphous semiconductor material, or an organic semiconductor material;

a source zone, a body zone, a drift zone and a drain zone in the first semiconductor layer;

a drift control zone in the second semiconductor layer, being arranged adjacent to the drift zone, comprising a control terminal for applying a control potential at a first lateral end, and being connected to the drain zone via a rectifying element at a second lateral end; and a gate electrode, being arranged adjacent to the body zone and being dielectrically insulated from the body zone by a gate dielectric layer.

10. The arrangement of claim 2, wherein the second semiconductor layer comprises a polycrystalline or amorphous semiconductor material, or an inorganic semiconductor material.

11. The arrangement of claim 2, comprising wherein the rectifying element is polarized such that at blocking transistor component electrically discharging of the drift control zone to an electrical potential of the drain zone is prevented.

12. The arrangement of claim 2, comprising wherein a capacitive storage element is connected to the control terminal of the drift control zone.

13. The arrangement of claim 2, comprising wherein the control terminal of the drift control zone is coupled to the gate electrode wire a rectifying element.

* * * * *